US010943644B1

(12) United States Patent
Lee

(10) Patent No.: US 10,943,644 B1
(45) Date of Patent: Mar. 9, 2021

(54) APPARATUSES INCLUDING THRESHOLD VOLTAGE COMPENSATED SENSE AMPLIFIERS AND METHODS FOR COMPENSATING SAME

(71) Applicant: MICRON TECHNOLOGY, INC., Boise, ID (US)

(72) Inventor: Kyuseok Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/795,293

(22) Filed: Feb. 19, 2020

(51) Int. Cl.
*G11C 11/40* (2006.01)
*G11C 11/4091* (2006.01)
*G11C 7/12* (2006.01)
G11C 7/06 (2006.01)
G11C 5/14 (2006.01)

(52) U.S. Cl.
CPC ............ *G11C 11/4091* (2013.01); *G11C 7/12* (2013.01); *G11C 5/14* (2013.01); *G11C 7/06* (2013.01)

(58) Field of Classification Search
None
See application file for complete search history.

(56) References Cited

U.S. PATENT DOCUMENTS

| 5,325,335 | A * | 6/1994 | Ang | ............ G11C 11/419 365/203 |
|---|---|---|---|---|
| 7,317,646 | B2 | 1/2008 | Yoon et al. | |
| 7,355,913 | B2 | 4/2008 | Kang et al. | |
| 7,359,268 | B2 | 4/2008 | Kang et al. | |
| 9,202,531 | B2 | 12/2015 | Seo | |
| 10,074,408 | B2 | 9/2018 | Seo | |
| 2006/0181917 | A1 | 8/2006 | Kang et al. | |
| 2006/0221665 | A1 | 10/2006 | Kang et al. | |
| 2011/0133809 | A1 * | 6/2011 | Goel | ................. G11C 11/4091 327/307 |
| 2019/0180811 | A1 | 6/2019 | Kim et al. | |
| 2019/0237114 | A1 | 8/2019 | Won et al. | |

OTHER PUBLICATIONS

U.S. Appl. No. 16/183,594, titled "Apparatuses Including Threshold Voltage Compensated Sense Amplifiers and Methods for Compensating Same", filed Nov. 7, 2018.

\* cited by examiner

Primary Examiner — Tan T. Nguyen
(74) Attorney, Agent, or Firm — Dorsey & Whitney LLP

(57) ABSTRACT

Apparatuses and methods including threshold voltage compensated sense amplifiers and methods for compensating same are disclosed. An example apparatus includes first and second pull-up transistors coupled to a first power supply node, and first and second pull-down transistors coupled to a second power supply node. A first isolation transistor is coupled to a gate of the second pull-down transistor and to a first sense node to which the first pull-up and first pull-down transistors are also coupled. A second isolation transistor is coupled to a gate of the first pull-down transistor and to a second sense node to which the second pull-up and second pull-down transistors are also coupled. An equalization transistor is coupled to gates of the first and second pull-down transistors, and a precharge transistor is coupled to the second power supply node and to the gate of either the first or second pull-down transistors.

20 Claims, 9 Drawing Sheets

US 10,943,644 B1

APPARATUSES INCLUDING THRESHOLD VOLTAGE COMPENSATED SENSE AMPLIFIERS AND METHODS FOR COMPENSATING SAME

BACKGROUND

Memory devices are structured to have one or more arrays of memory cells that are arranged, at least logically, in rows and columns. Each memory cell stores data as an electrical charge that is accessed by a digit line associated with the memory cell. A charged memory cell, when the memory cell is accessed, causes a positive change in voltage on the associated digit line, and an accessed memory cell that is not charged causes a negative change in voltage on the associated digit line. The change in voltage on the digit line may be sensed and amplified by a sense amplifier to indicate the value of the data state stored in the memory cell.

Conventional sense amplifiers are typically coupled to a pair of complementary digit lines to which a large number of memory cells (not shown) are connected. As known in the art, when memory cells are accessed, a row of memory cells are activated and sense amplifiers are used to amplify a data state for the respective column of activated memory cells by coupling each of the digit lines of the selected column to voltage supplies such that the digit lines have complementary logic levels.

When a memory cell is accessed, the voltage of one of the digit lines increases or decreases slightly, depending on whether the memory cell coupled to the digit line is charged or not, resulting in a voltage difference between the digit lines. While the voltage of one digit line increases or decreases slightly, the other digit line does not and serves as a reference for the sensing operation. Respective transistors are enabled due to the voltage difference, thereby coupling the slightly higher voltage digit line to a supply voltage and the other digit line to a reference voltage, such as ground to further drive each of the digit lines in opposite directions and amplify the selected digit line signal.

The digit lines are precharged during a precharge period to a precharge voltage, such as one-half of a supply voltage, so that a voltage difference can be accurately sensed and amplified during a subsequent sensing operation. However, due to threshold voltage mismatch of transistor components, the digit lines may be imbalanced before a voltage change is sensed and amplified on one of the digit lines. Such threshold voltage mismatches can cause the sense amplifier to erroneously amplify input signals in the wrong direction. There is, therefore, a need for a sense amplifier design that reduces threshold voltage mismatches.

DETAILED DESCRIPTION

Certain details are set forth herein to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

Various embodiments of the present disclosure will be explained below in detail with reference to the accompanying drawings. The following detailed description refers to the accompanying drawings that show, by way of illustration, specific aspects and embodiments of the disclosure. The detailed description includes sufficient detail to enable those skilled in the art to practice the embodiments of the disclosure. Other embodiments may be utilized, and structural, logical and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
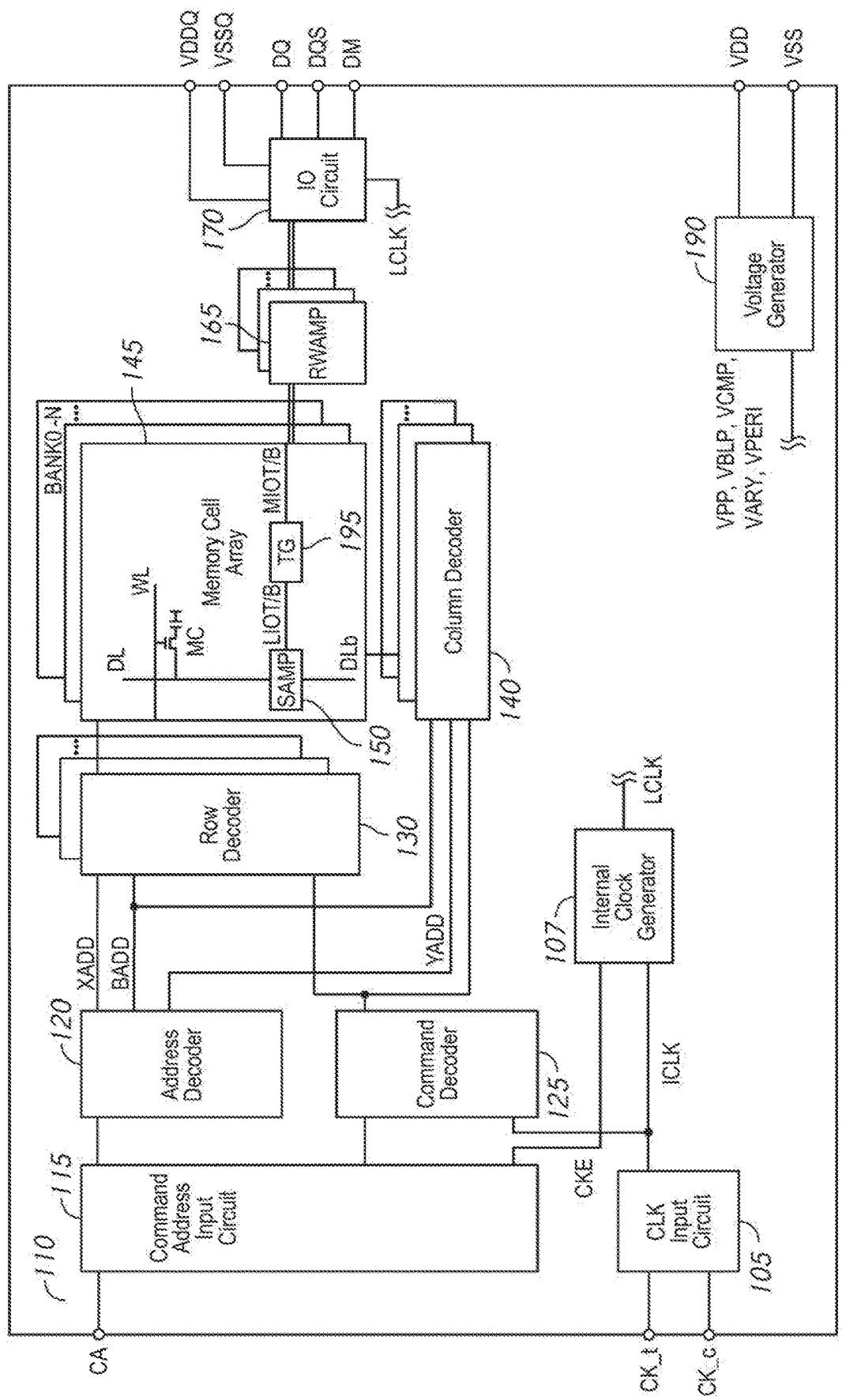
FIG. 1 is a schematic block diagram of a semiconductor device in accordance with an embodiment of the present disclosure.

FIG. 1 is a schematic block diagram of a semiconductor device 100, in accordance with an embodiment of the present disclosure. The semiconductor device 100 may include a clock input circuit 105, an internal clock generator 107, a timing generator 109, an address command input circuit 115, an address decoder 120, a command decoder 125, a plurality of row (e.g., first access line) decoders 130, a memory cell array 145 including sense amplifiers 150 and transfer gates 195, a plurality of column (e.g., second access line) decoders 140, a plurality of read/write amplifiers 165, an input/output (I/O) circuit 170, and a voltage generator 190.

The semiconductor device 100 may include a plurality of external terminals including command/address terminals CA, clock terminals CK_t and CK_c, data terminals DQ, DQS, and DM, and power supply terminals VDD, VSS, VDDQ, and VSSQ. The terminals and signal lines associated with the command/address terminal CA may include a first set of terminals and signal lines that are configured to receive the command signals and a separate, second set of terminals and signal lines that configured to receive the address signals, in some examples. In other examples, the terminals and signal lines associated with the command/address terminal CA may include shared terminals and signal lines that are configured to receive both command signal and address signals. The semiconductor device may be mounted on a substrate, for example, a memory module substrate, a motherboard or the like.

The memory cell array 145 includes a plurality of banks BANK0-N, where N is a positive integer, such as 3, 7, 15, 31, etc. Each bank BANK0-N may include a plurality of word lines WL, a plurality of digit lines DL, and a plurality of memory cells MC arranged at intersections of the plurality of word lines WL and the plurality of digit lines DL and DLb. The selection of the word line WL for each bank BANK0-N is performed by a corresponding row decoder 130 and the selection of the digit lines DL and DLb is performed by a corresponding column decoder 140. The digit lines DL and DLb are coupled to a respective one of a plurality of sense amplifiers SAMP 150. The plurality of sense amplifiers 150 are coupled to at least one respective local I/O line pairs LIOT/B that is further coupled to a respective one of at least two main I/O line pairs MIOT/B, via transfer gates TG 195, which function as switches. The sense amplifiers 150 and transfer gates TG 195 may be operated based on control signals from decoder circuitry, which may include the command decoder 120, the row decoders 130, the column decoders 140, any control circuitry of the memory cell array 145 of the banks BANK0-N, or any combination thereof.

In some examples, the plurality of sense amplifiers 150 may include threshold voltage compensation circuitry that compensates for threshold voltage differences between components of the sense amplifiers 150. As circuit components become smaller, clock speeds become faster, and voltage/power consumption requirements are reduced, small variances in the performance between circuit components of the sense amplifiers 150 (e.g., due to process, voltage, and temperature (PVT) variance) may reduce operational reliability of the semiconductor device 100. To mitigate effects of these variations, compensating for some of these threshold voltage vth differences may include, before activating the sense amplifier 150 to sense data, biasing digit lines DL and DLb coupled to the sense amplifiers 150 using internal nodes of the sense amplifier 150 that are configured to provide sensed data to an output. The bias of the digit lines DL and DLb may be based on threshold differences between at least two circuit components (e.g., transistors) of the sense amplifier 150. While compensating for threshold voltage vth differences between circuit components within the sense amplifier 150 may improve reliability.

The command/address input circuit 115 may receive an address signal and a bank address signal from outside at the command/address terminals and transmit the address signal and the bank address signal to the address decoder 120. The address decoder 120 may decode the address signal received from the command/address input circuit 115 and provide a row address signal XADD to the row decoder 130, and a column address signal YADD to the column decoder 140. The address decoder 120 may also receive the bank address signal and provide the bank address signal BADD to the row decoder 130 and the column decoder 140.

The command/address input circuit 115 may receive a command signal from outside, such as, for example, a memory controller 105 at the command/address terminals and provide the command signal to the command decoder 125. The command decoder 125 may decode the command signal and generate various internal command and control signals. The internal command and control signals may be used to control operation and timing of various circuits of the semiconductor device 100. For example, the internal command signals may include row and column command signals to control circuits to perform access operations to selected word lines and digit lines, such as a read command or a write command. Example control signals may include internal control signals for controlling the timing of voltage circuits to provide different voltages during operation of various circuits, for example, during voltage threshold compensation of sense amplifiers 150.

When an activate command is issued and a row address is timely supplied with the activate command, and a column address is timely supplied with a read command, read data is read from a memory cell in the memory cell array 145 designated by the row address and the column address. The read/write amplifiers 165 may receive the read data DQ and provide the read data DQ to the IO circuit 170. The IO circuit 170 may provide the read data DQ to outside via the data terminals DQ, DQS and DM together with a data strobe signal at DQS and a data mask signal at DM. Similarly, when an activate command is issued and a row address is timely supplied with the activate command, and a column address is timely supplied with a write command, write data supplied to the data terminals DQ, DQS, DM, together with a data strobe signal at DQS and a data mask signal at DM are written via the read/write amplifiers 165 to the memory cell array 145. Thus, the write data may be written in the memory cell designated by the row address and the column address.

Turning to the explanation of the external terminals included in the semiconductor device 100, the clock terminals CK_t and CK_c may receive an external clock signal and a complementary external clock signal, respectively. The external clock signals (including complementary external clock signal) may be supplied to a clock input circuit 105. The clock input circuit 105 may receive the external clock signals and generate an internal clock signal ICLK. The clock input circuit 105 may provide the internal clock signal ICLK to an internal clock generator 107. The internal clock generator 107 may generate a phase controlled internal clock signal LCLK based on the received internal clock signal ICLK and a clock enable signal CKE from the address/command input circuit 115. Although not limited thereto, a DLL circuit may be used as the internal clock generator 107. The internal clock generator 107 may provide the phase controlled internal clock signal LCLK to the IO circuit 170 and a timing generator 109. The IO circuit 170 may use the phase controlled internal clock signal LCLK as a timing signal for determining an output timing of read data. The timing generator 109 may receive the internal clock signal ICLK and generate various internal clock signals.

The power supply terminals may receive power supply voltages VDD and VSS. These power supply voltages VDD and VSS may be supplied to a voltage generator circuit 190. The voltage generator circuit 190 may generate various internal voltages, VPP, VBLP, VCMP, VARY, VPERI, and the like based on the power supply voltages VDD and VSS. The internal voltage VPP is mainly used in the row decoder 130, the internal voltages VBLP, VCMP, and VARY are mainly used in the sense amplifiers 150 included in the memory cell array 145, and the internal voltage VPERI is used in many other circuit blocks. The IO circuit 170 may receive the power supply voltages VDD and VSSQ. For example, the power supply voltages VDDQ and VSSQ may be the same voltages as the power supply voltages VDD and VSS, respectively. However, the dedicated power supply voltages VDDQ and VSSQ may be used for the IO circuit 170.

Figure 2:
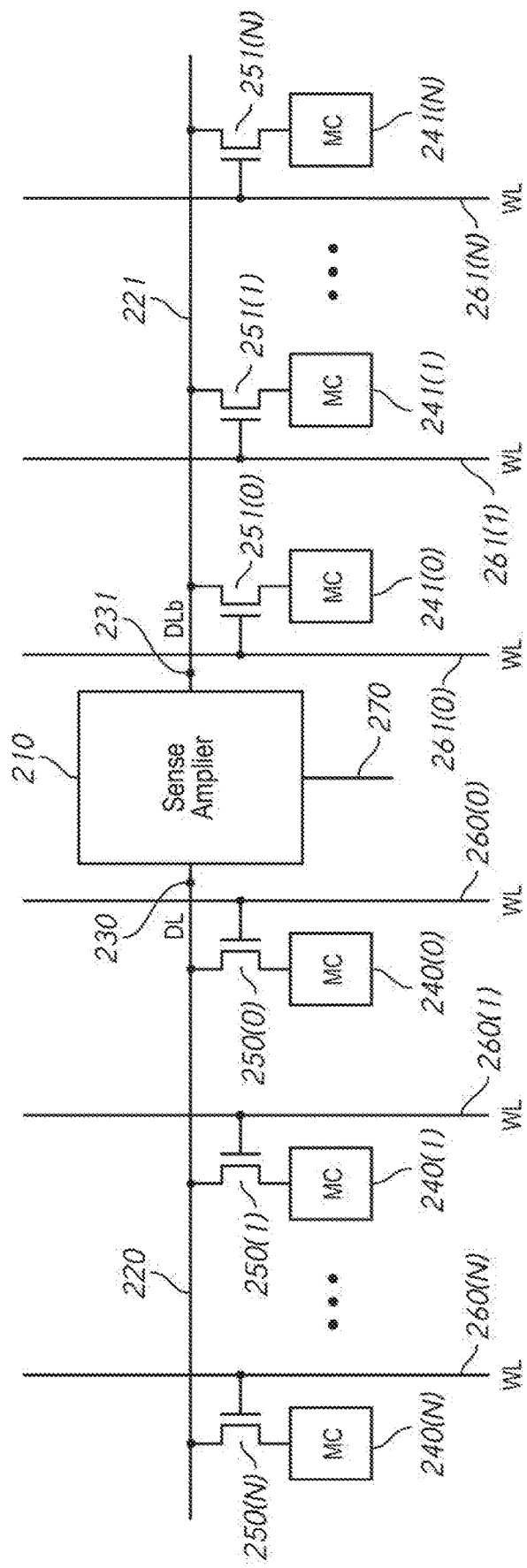
FIG. 2 is a schematic diagram of a portion of a memory that includes a sense amplifier and a pair of complementary digit lines according to an embodiment of the disclosure.

FIG. 2 is a schematic diagram of a portion of a memory 200 that includes a sense amplifier 210 and a pair of complementary digit lines DL 220 and DLb 221 according to an embodiment of the disclosure. As shown in FIG. 2, the sense amplifier 210 is coupled to the pair of true and complementary digit (or bit) lines DL 220 and DLb 221 at sense nodes 230 and 231, respectively. The memory cells 240(0)-(N) may be selectively coupled through respective access devices (e.g., transistors) 250(0)-(N) to the digit line DL 220 and memory cells 241(0)-(N) may be selectively coupled through respective access devices (e.g., transistors) 251(0)-(N) to the digit line DLb 221. Wordlines WL 260 (0)-(N) may control which of the memory cells 240(0)-(N) is coupled to the digit line DL 220 by controlling a respective access device 250(0)-(N). Similarly, wordlines WL 261(0)-(N) may control which of the memory cells 241(0)-(N) is coupled to the digit line DLb 221 by controlling a respective access device 251(0)-(N). The sense amplifier 210 may be controlled via control signals 270 received via a decoder circuit, such as any of a command decoder (e.g., the command decoder 125 of FIG. 1), a row decoder (e.g., the row decoder 130 of FIG. 1), a column decoder (e.g., the column decoder 140 of FIG. 1), memory array control circuitry (e.g., the control circuitry of the memory cell array 145 of the memory banks BANK0-N of FIG. 1), or any combination thereof.

In some examples, the memory 200 may operate in general phases or modes. A first phase (e.g., precharge phase) may be initiated in response to a precharge command. During the precharge phase, the wordlines WL 260(0)-(N) and 261(0)-(N) may be set to an inactive state, and in response, the access devices 250(0)-(N) and 251(0)-(N) may all be disabled. Further, the digit lines DL 220 and DLb 221 and internal nodes of the sense amplifier 210 that are configured to provide a sensed data state to an output may be precharged to a precharge voltage until transitioning to a following phase.

In some examples, sense amplifier 210 includes threshold voltage compensation circuitry that compensates for threshold voltage mismatches between components of the sense amplifier 210 during a threshold voltage compensation phase. To perform the threshold voltage compensation, the sense amplifier 210 may, during a threshold voltage compensation phase, precharge or bias the digit lines DL 220 and DLb 221 such that a voltage difference between the digit line DL 220 and the DLb 221 is approximately equal to threshold voltage differences between at least two circuit components of the sense amplifier 210. In some examples, the threshold voltage difference may be based on threshold voltages of transistors of the sense amplifier 210. Compensating for threshold voltage vth differences between circuit components within the sense amplifier 210 may improve reliability.

A third phase is a digit line sampling phase. During the sampling phase, a wordline WL of the wordlines WL 260(0)-(N) and 261(0)-(N) may be set to an active state, and, in response, an access device of the access devices 250(0)-(N) and 251(0)-(N) may be enabled to couple a respective memory cell of the memory cells 240(0)-(N) and 241(0)-(N) to one of the digit lines DL 220 and DLb 221. A fourth phase may be a sense amplifier activation phase. The sense amplifier 210 may be activated to perform a sense operation to sense a data state of the activated memory cell. That is, during a sense operation, a data state stored by the activated memory cell is sensed and amplified by the sense amplifier 210 to drive one of the digit line DL 220 or the digit line DLb 221 to a high or low voltage level corresponding to the sensed data state and to drive the other digit line of the digit lines DL 220 and DLb 221 to the complementary voltage level during the sense operation. After the sense operation, the circuitry of the memory 200 may remain in the activation phase or may transition back to the precharge phase in response to a precharge command.

Similarly, when accessed, a memory cell of the memory cells 241(0)-(N) is coupled to the digit line DLb 221 through the respective access device 251(0)-(N) in response to a respective word line 261(0)-(N) becoming active. A data state stored by the memory cell is sensed and amplified by the sense amplifier 210 to drive the digit line DLb 221 to a high or low voltage level corresponding to the sensed data state. The other digit line DL 220 is driven to the complementary voltage level (e.g., the high voltage level is complementary to the low voltage level and the low voltage level is complementary to the high voltage level) during the sense operation.

During the threshold voltage compensation operation, the sense nodes 230 and 231 of the sense amplifier 210 may be isolated from one another in response to the control signals 270 (e.g., from a decoder circuit). In some examples, the control signals 270 may configure the sense amplifier 210 to isolate the sense nodes 230 and 231 during the threshold voltage compensation phase. For example, during the precharge phase, the sense nodes 230 and 231 of the sense amplifier 210 may be coupled to each other, and to a precharge voltage to be precharged to the precharge voltage. After the sense nodes 230 and 231 of the sense amplifier 210 are precharged, the control signals 270 may configure the sense amplifier 210 to isolate the sense nodes 230 and 231 from each other. A voltage difference may then be developed at the sense nodes 230 and 231 to provide threshold voltage compensation.

Figure 3:
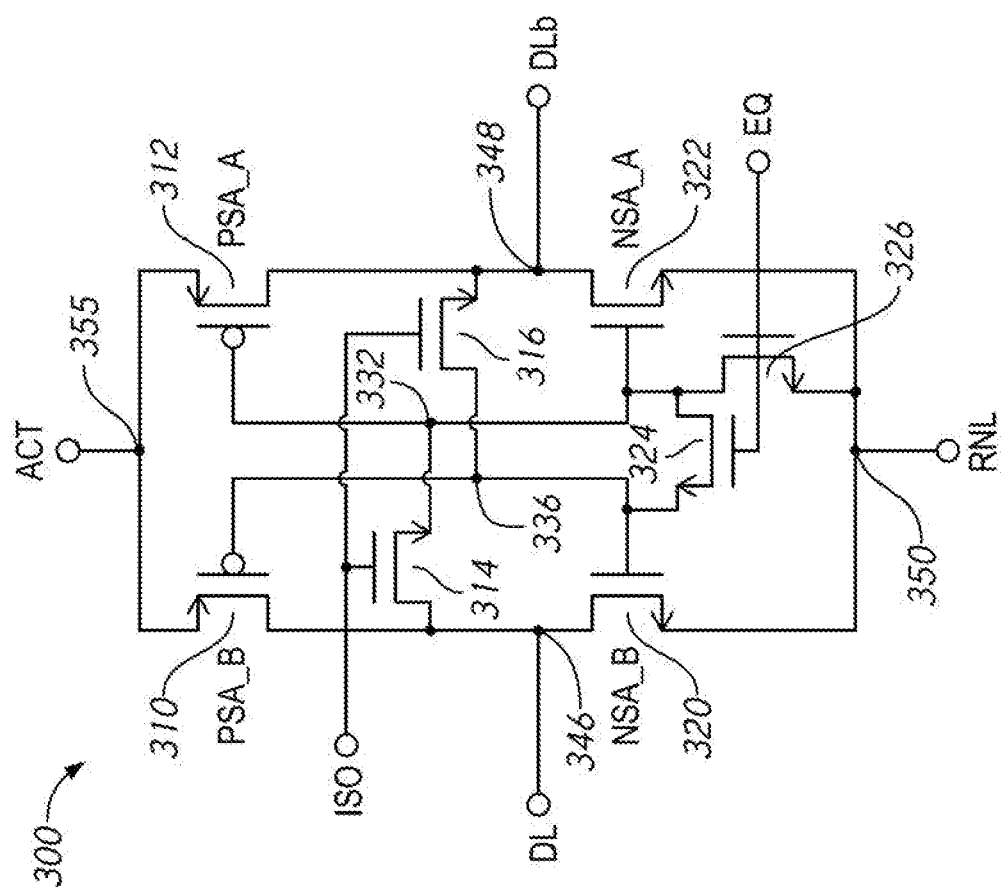
FIG. 3 is a schematic diagram of a sense amplifier in accordance with an embodiment of the disclosure.

FIG. 3 is a schematic diagram of a sense amplifier 300 in accordance with an embodiment of the disclosure. In some embodiments of the disclosure, the sense amplifier 300 may be included in one or more of the sense amplifiers 150 of FIG. 1 and/or the sense amplifier 210 of FIG. 2.

The sense amplifier 300 includes pull-up transistors 310 and 312 having drains coupled to nodes 346 and 348, respectively. The nodes 346 and 348 may be referred to as sense nodes. Sources of pull-up transistors 310 and 312 are coupled to power supply that provides power supply voltage ACT at power supply node 355. Gates of pull-up transistors 310 and 312 are coupled to gut nodes 336 and 332, respectively. The sense amplifier further includes pull-down transistors 320 and 322. A source of pull-down transistor 320 is coupled to power supply that provides a power supply voltage RNL at power supply node 350 and a drain is coupled to sense node 346. A source of pull-down transistor 322 is coupled to the power supply node 350 and a drain is coupled to sense node 348. Gates of pull-down transistors 320 and 322 are coupled to nodes gut 336 and 332, respectively.

Further, the sense amplifier 300 includes isolation (ISO) transistors 314 and 316. The source of ISO transistor 314 is coupled to gut node 332 and its drain is coupled to sense node 346. The source of ISO transistor 316 is coupled to sense node 348 and its drain is coupled to gut node 336. Sense amplifier 300 further includes equalization transistor 324 and precharge transistor 326 activated at their gates by an active control signal EQ (e.g., active high logic level). The equalization transistor 324 is coupled across the gates of the pull-down transistors 320 and 322. The precharge transistor 326 is coupled the power supply node 350 and a gate of either the pull-down transistors 322 and 320 (e.g., shown in FIG. 3 coupled to the gate of the pull-down transistor 322).

A digit line DL is coupled to the sense node 346 and a digit line DLb is coupled to sense node 348. The digit line DL may represent digit line DL 220 of FIG. 2 and the digit line DLb may represent digit line DLb 221 in some embodiments of the disclosure.

In FIG. 3, pull-up transistors 310 and 312 are shown as p-type field effect transistors (PFETs) and pull-down transistors 320 and 322, isolation transistors 314 and 316, equalization transistor 324, and precharge transistor 326 are shown as n-type field effect transistors (NFETs). However, one or more of the transistors may be changed to a different type, to a different transistor, to a different circuit without departing from the scope of the disclosure.

As will be described below, the sense amplifier 300 may provide threshold voltage compensation. For example, the sense amplifier 300 may provide threshold voltage compensation for the threshold voltages of the pull-down transistors 320 and 322. The sense amplifier 300 may provide advantageous over conventional sense amplifiers providing threshold voltage compensation. For example, the sense amplifier 300 may include fewer circuit components (e.g., transistors) in comparison to such other sense amplifier designs. As a result, the sense amplifier 300, as well as other sense amplifiers according to embodiments of the disclosure, may provide a more compact circuit design and have less circuit complexity.

Figure 5:
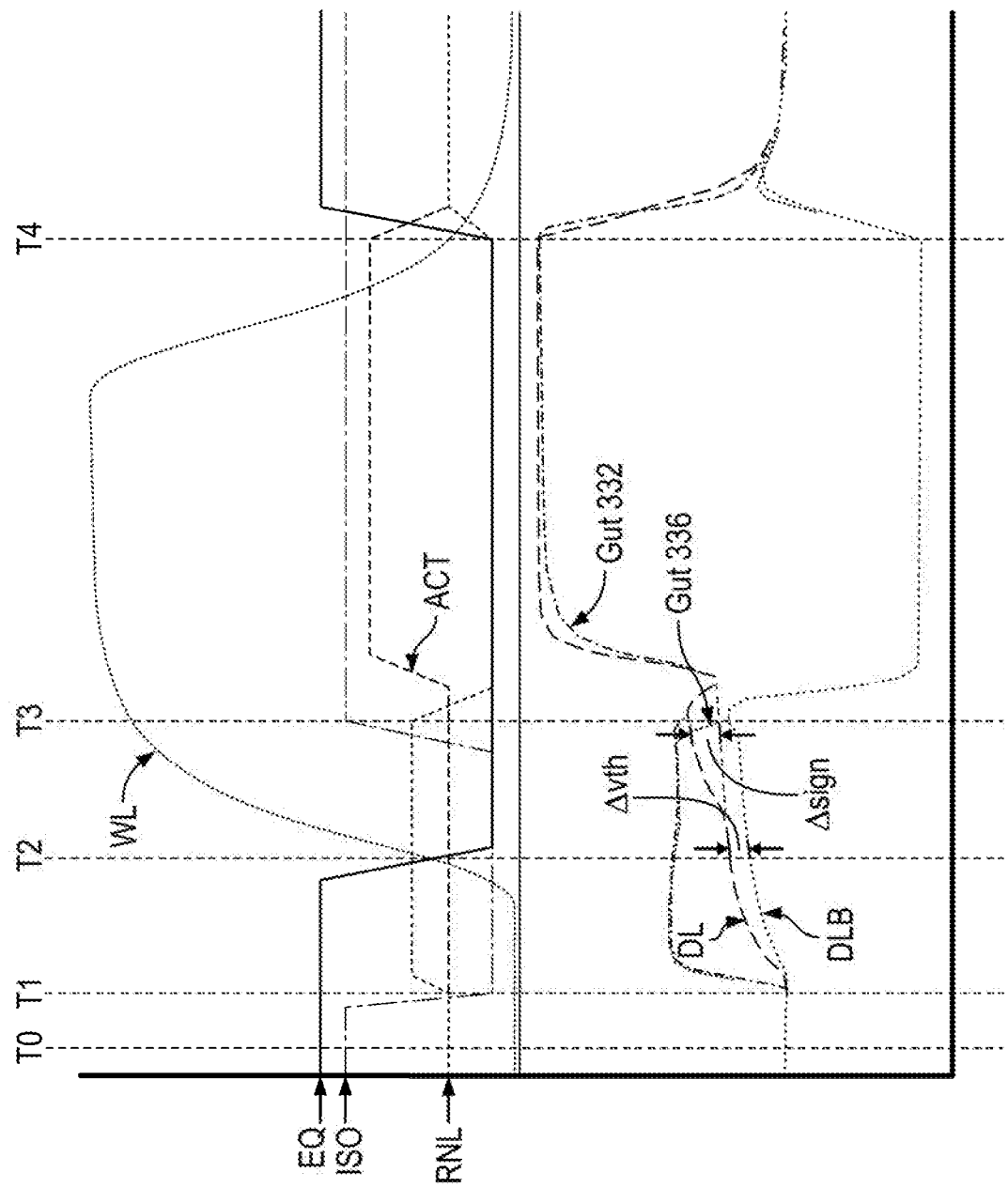
FIG. 5 is a timing diagram of various signals during the operation of a sense amplifier according to an embodiment of the disclosure.

An example operation of the sense amplifier 300 according to an embodiment of the disclosure is described with reference to FIG. 5. FIG. 5 is a timing diagram of various signals during the operation of a sense amplifier according to an embodiment of the disclosure. In some embodiments of the disclosure, the sense amplifier 300 of FIG. 3 may be operated according to the example of FIG. 5. The example operation of FIG. 5 will be described with reference to the sense amplifier of FIG. 3, however, neither the sense amplifier 300 or the example operation of FIG. 5 are limited as such.

In the example operation, it is assumed that pull-down transistor 322 has a threshold voltage (vth+Δvth) that is different than a threshold voltage (vth) of pull-down transistor 320. Thus, the threshold voltage of pull-down transistor 322 deviates from threshold voltage of pull-down transistor 320 by Δvth. FIG. 5 shows an example operation of the sense amplifier 300 designed to compensate for the threshold voltage difference of pull-down transistors 322 and 320.

With reference to FIG. 5, following time T0, the power supply node 355 and the power supply node 350 are provided a precharge voltage (e.g., 0.35V) by power supplies ACT and RNL, respectively. The control signal EQ is also active (e.g., active high logic level, such as 1.4V) to activate the equalization transistor 324 and activate the precharge transistor 326. As a result, gut node 332 at gates of the pull-up and pull-down transistors 312 and 322 and gut node 336 at gates of the pull-up and pull-down transistors 310 and 320 are coupled together through the active equalization transistor 324, and provided the precharge voltage through the active precharge transistor 326 from the power supply node 350.

Also at time T0, the control signal ISO signal is active (e.g., active high logic level, such as 1.2V) to activate the isolation transistors 316 and 314 and couple the gut node 336 to the sense node 348 (and the digit line DLb) and to couple the gut node 332 to the sense node 346 (and the digit line DL). As a result, the sense nodes 346 and 348 (and digit lines DL and DLb) are also provided the precharge voltage from the power supply node 350.

Prior to time T1, the control signal ISO becomes inactive (e.g., inactive low logic level, such as 0V), deactivating the isolation transistors 316 and 314 and thus isolating the gut nodes 332 and 336 from the sense nodes 346 and 348, respectively.

The operation between times T0 and T1 may be referred to as a precharge phase. During the precharge phase the sense nodes 346 and 348, and the digit lines DL and DLb are equalized, set to the precharge voltage, and isolated at the precharge voltage.

Following time T1, the power supply voltage RNL provided to the power supply node 350 changes to a compensation voltage (e.g., 0.65V) and the power supply voltage ACT provided to the power supply node 355 continues to be the precharge voltage. The equalization transistor 324 and the precharge transistor 326 remain activated to provide the compensation voltage to the gut node 332 at the gates of the pull-up and pull-down transistors 312 and 322 and to the gut node 336 at the gates of the pull-up and pull-down transistors 310 and 320. Source nodes of the pull-down transistors 322 and 320 are also provided the compensation voltage from the power supply node 350.

With the gates and source nodes of the pull-down transistors 322 and 320 set at the compensation voltage, the pull-down transistors 322 and 320 are effectively diode coupled. As a result, a voltage of (PRE−vth_A) is set at the sense node 348 (a drain of the pull-down transistor 322) and a voltage of (PRE−vth_B) is set at the sense node 346 (a drain of the pull-down transistor 320), where PRE is the precharge voltage (e.g., 0.65V), vth_A is the threshold voltage of the pull-down transistor 322, and vth_B is the threshold voltage of the pull-down transistor 320.

In the present example, as previously described, it is assumed the threshold voltage of the pull-down transistor 322 is greater than the threshold voltage of the pull-down transistor 320 by Δvth. That is, where the threshold voltage of the pull-down transistor 320 is vth, the threshold voltage of the pull-down transistor 322 is vth+Δvth. The resulting voltage at the sense node 346 (and digit line DL) is (PRE−vth) and the resulting voltage at the sense node 348 (and the digit line DLb) is (PRE−vth−Δvth). The voltage differential between the sense nodes 346 and 348 compensates for a threshold voltage difference between the pull-down transistors 322 and 320.

Prior to time T2, the control signal EQ becomes inactive (e.g., inactive low logic level, such as 0V) deactivating the equalization transistor 324 and the precharge transistor 326, and thus isolating gut node 332 and 336.

The operation between times T1 and T2 may be referred to as a threshold voltage compensation (vtc) phase. During the threshold voltage compensation phase the sense nodes (and the digit lines) are set at respective compensation voltages to compensate for a threshold voltage difference between the pull-down transistors 322 and 320.

Following time T2, an access line WL may be activated (e.g., changes to an activation (high) voltage level) to couple a memory cell to a digit line. The memory cell may change the voltage of the digit line to which it is coupled. In the present example, it is assumed that activation of the access line WL couples a memory cell to the digit line DL (and to the sense node 346). It is further assumed that the memory cell stores a high cell state, which causes a voltage of the digit line DL to increase (e.g., by a voltage Δsign) when coupled to the digit line DL.

Prior to time T3, the control signal ISO become active, activating the isolation transistors 316 and 314. The activated isolation transistor 316 couples the sense node 348 (and the digit line DLb) to the gut node 336 at the gates of the pull-up and pull-down transistors 310 and 320. The activated isolation transistor 314 couples the sense node 346 (and the digit line DL) to the gut node 332 at the gates of the pull-up and pull-down transistors 312 and 322. As a result, the voltage (PRE−vth−Δvth) of the digit line DLb is provided to the gut node 336 and the voltage (PRE−vth+Δsign) of the digit line DL is provided to the gut node 332.

The operation between times T2 and T3 may be referred to as a digit line sampling phase. During the digit line sampling phase a memory cell is coupled to one of the digit lines, and the digit lines are coupled to gates of respective pull-up and pull-down transistors.

Following time T3, the power supply voltage RNL provided to the power supply node 350 changes to a low activation voltage (e.g., 0V) and the power supply voltage ACT provided to the power supply node 355 changes to a high activation voltage (e.g., 1.0V) to "activate" the sense amplifier. The respective voltages at the power supply nodes 355 and 350 cause the voltage difference between the digit lines DL and DLb to be amplified by driving the sense nodes and digit lines to opposite voltage levels (e.g., high and low activation voltages) based on the voltage difference. The gut nodes 332 and 336 may also be driven to opposite voltage levels as well.

In the present example, with the memory cell increasing the voltage of the digit line DL, the pull-down transistor 322 is activated to a greater degree than the pull-down transistor 320. As a result, the digit line DLb (and the gut node 336) begins to be pulled down to the low activation voltage provided to the power supply node 350, which in turn begins to activate the pull-up transistor 310 to pull-up the gut node 332 and further activate the pull-down transistor 322. With the positive feedback loop of the pull-down transistor 322 and pull-up transistor 310, the digit line DLb (and sense node 348 and the gut node 336) is driven to the low activation voltage and the digit line DL (and sense node 346 and the gut node 332) is driven to the high activation voltage. Prior the time T4, the access line WL becomes inactive (e.g., changes to an inactive (low) voltage level) to isolate the memory cell from the digit line DL.

The operation between times T3 and T4 may be referred to as a sense amplifier activation phase. During the sense amplifier activation phase the sense amplifier is activated by providing high and low activation voltages to the sense amplifier, and a voltage difference between the digit lines DL and DLb (e.g., resulting from the coupling of a memory cell to one of the digit lines) is amplified by driving the digit lines DL and DLb to opposite activation voltages based on the voltage difference.

Following time T4, the sense amplifier may be prepared for another sensing operation by precharging the digit lines DL and DLb, as previously described. For example, the control signal EQ becomes active and activates the equalization transistor 324 and the precharge transistor 326. Additionally, following time T4, the power supply voltage ACT and RNL provided to the power supply node 355 and the power supply node 350, respectively, changes to a precharge voltage. As a result, the digit lines DL and DLb are equalized through the active equalization transistor 324 and set to the precharge voltage through the active precharge transistor 326. The sense amplifier 300 is placed into the same precharged state as previously described at time T0, and is ready for another access operation.

In the example of FIG. 5, the power supply voltages ACT and RNL, and the control signals EQ, ISO are shown with a particular timing relative to the other voltages and control signals. However, embodiments of the disclosure include other voltage and signal timings different from those described with reference to FIG. 5. Thus, the scope of the disclosure is not limited to the particular example of FIG. 5.

The power supply voltages provided to the power supply node ACT and power supply node RNL as described with reference to FIG. 5 may be provided by a voltage circuit. The voltage circuit may be controlled by internal signals, for example, from a command decoder (e.g., command decoder 125 of FIG. 1, in some embodiments of the disclosure).

Figure 4:
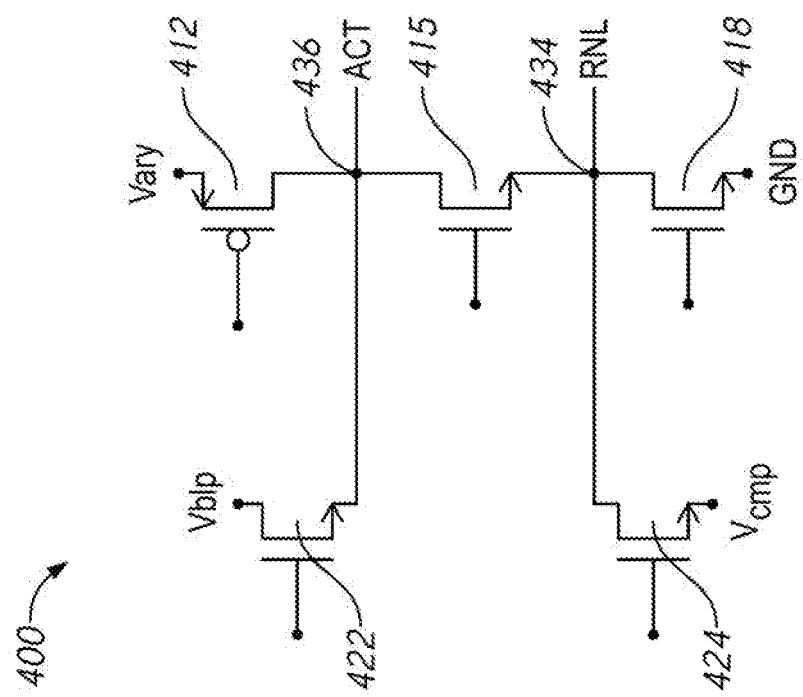
FIG. 4 is a schematic diagram of a voltage circuit according to an embodiment of the disclosure.

FIG. 4 is a schematic diagram of a voltage circuit 400 according to an embodiment of the disclosure. The voltage circuit 400 may be used to provide power supply voltages ACT and RNL to the power supply nodes 355 and 350 in some embodiments of the disclosure. For example, the voltage circuit 400 may provide the power supply voltages ACT and RNL to the power supply nodes 355 and 350 as described with reference to the example operation of FIG. 5.

The voltage circuit 400 includes a transistor 412 that provides a power supply voltage Vary to a power output node 436 when activated, and a transistor 422 that provides a power supply voltage Vblp to the power output node 436 when activated. The power output node 436 may be coupled, for example, to a power supply node 355 to provide the power supply voltages Vary and/or Vblp as the power supply voltage ACT. The voltage circuit 400 further includes a transistor 418 that provides a power supply voltage GND (e.g., ground) to a power output node 434 when activated, and a transistor 424 that provides a power supply voltage Vcmp to the power output node 434 when activated. The power output node 434 may be coupled, for example, to a power supply node 350 to provide the power supply voltages GND and/or Vcmp as the power supply voltage RNL. A transistor 415 couple together the power output nodes 434 and 436 when activated. The transistors of the voltage circuit 400 may be controlled by internal control signals to provide the different power supply voltages.

In some embodiments of the disclosure, the power supply voltage Vary may be 1.0V, the power supply voltage Vblp may be 0.35V, the power supply voltage Vcmp may be 0.65V, and/or the power supply GND may be 0.0V.

In operation, the transistor 415 of the voltage circuit 400 may be activated to couple together the power output nodes 434 and 436 to provide the same power supply voltage, and the transistor 422 may be activated so that the power supply voltage Vblp is provided to both the power output nodes 434 and 436. The voltage circuit 400 may be configured to provide the Vblp voltage as the power supply voltages ACT and RNL to power supply nodes 355 and 350 coupled to the power output nodes 436 and 434, for example, during a precharge phase of a sense amplifier.

Additionally, the transistor 415 may be deactivated and the transistor 424 activated so that the power output node 434 provides the power supply voltage Vcmp and the power supply node 436 continues to provide the power supply voltage Vblp. The voltage circuit 400 may be configured to provide the Vblp voltage as the power supply voltage ACT to the power supply node 355 coupled to the power output node 436 and to provide the Vcmp voltage as the power supply voltage RNL to the power supply node 350 coupled to the power output node 434, for example, during a threshold voltage compensation phase and/or during a sampling phase of a sense amplifier.

Additionally, the transistors 422 and 424 may be deactivated and the transistors 412 and 418 activated so that the power output node 436 provides the power supply voltage Vary and the power supply node 434 provides the power supply voltage GND. The voltage circuit 400 may be configured to provide the Vary voltage as the power supply voltage ACT to the power supply node 355 coupled to the power output node 436 and to provide the GND voltage as the power supply voltage RNL to the power supply node 350 coupled to the power output node 434, for example, as high and low activation voltages during a sense amplifier activation phase (which may include in some embodiments of the disclosure, pull-down and/or pull-up sense amplifier activation phases) of a sense amplifier.

Figure 6:
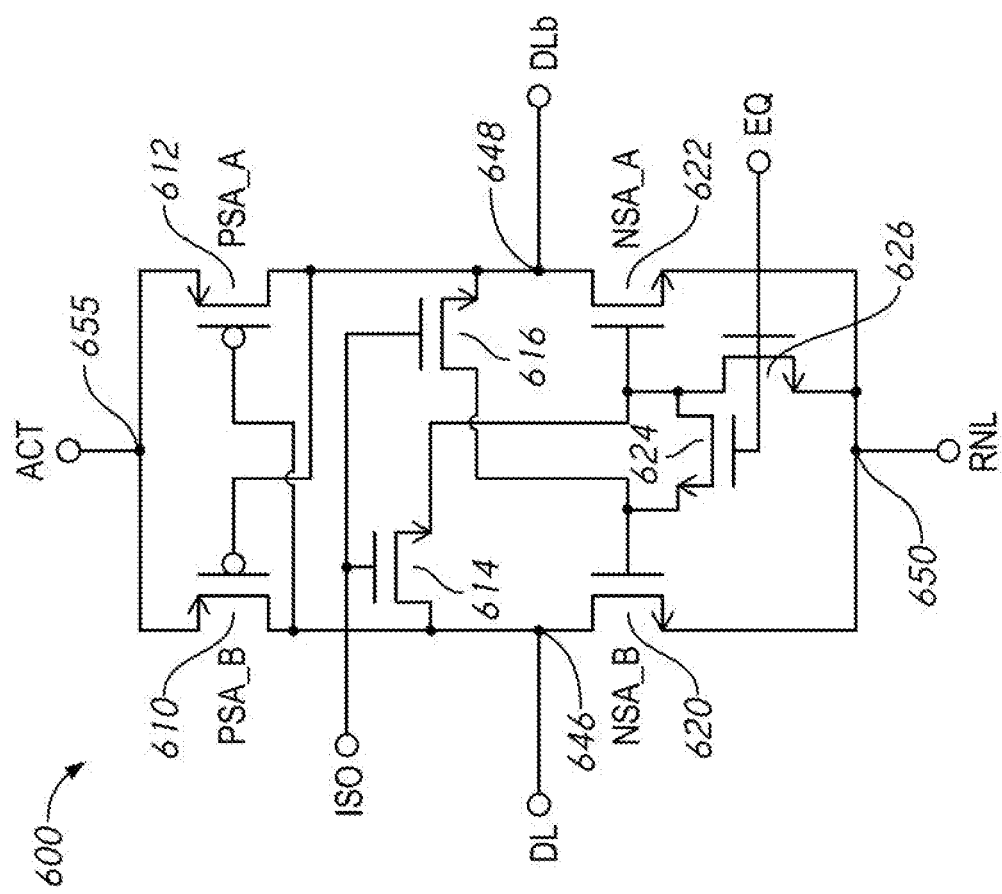
FIG. 6 is a schematic diagram of a sense amplifier in accordance with an embodiment of the disclosure.

FIG. 6 is a schematic diagram of a sense amplifier 600 in accordance with an embodiment of the disclosure. In some embodiments of the disclosure, the sense amplifier 600 may be included in one or more of the sense amplifiers 150 of FIG. 1 and/or the sense amplifier 210 of FIG. 2.

The sense amplifier 600 includes pull-up transistors 610 and 612 having drains coupled to nodes 646 and 648, respectively. The nodes 646 and 648 may be referred to as sense nodes. Sources of pull-up transistors 610 and 612 are coupled to power supply that provides power supply voltage ACT at power supply node 655. Gates of pull-up transistors 610 and 612 are coupled to sense nodes 648 and 646, respectively. The sense amplifier further includes pull-down transistors 620 and 622. A source of pull-down transistor 620 is coupled to power supply that provides a power supply voltage RNL at power supply node 650 and a drain is coupled to sense node 646. A source of pull-down transistor 622 is coupled to the power supply node 650 and a drain is coupled to sense node 648. Further, a gate of pull-down transistor 620 is coupled to the sense node 648 through isolation transistor 616 and a gate of pull-down transistor 622 is coupled to the sense node 646 through isolation transistor 614.

Sense amplifier 600 further includes equalization transistor 624 and precharge transistor 626 activated at their gates by an active control signal EQ (e.g., active high logic level). The equalization transistor 624 is coupled across the gates of the pull-down transistors 620 and 622. The precharge transistor 626 is coupled the power supply node 650 and a gate of either the pull-down transistors 622 and 620 (e.g., shown in FIG. 6 coupled to the gate of the pull-down transistor 622).

A digit line DL is coupled to the sense node 646 and a digit line DLb is coupled to sense node 648. The digit line DL may represent digit line DL 220 of FIG. 2 and the digit line DLb may represent digit line DLb 221 in some embodiments of the disclosure.

In FIG. 6, pull-up transistors 610 and 612 are shown as p-type field effect transistors (PFETs) and pull-down transistors 620 and 622, isolation transistors 614 and 616, equalization transistor 624, and precharge transistor 626 are shown as n-type field effect transistors (NFETs). However, one or more of the transistors may be changed to a different type, to a different transistor, to a different circuit without departing from the scope of the disclosure.

In contrast to the sense amplifier 300 of FIG. 3, the sense amplifier 600 includes pull-up transistors 610 and 612 having gates that are not coupled to the gut nodes 636 and 632, but instead, are coupled to the sense nodes 648 and 646. The alternative configuration of the sense amplifier 600 may provide a different layout of the sense amplifier, and may be better suited for some designs.

In some embodiments of the disclosure, the sense amplifier 600 may be operated similarly as described with reference to FIG. 5. Additionally, in some embodiments of the disclosure, the power supply voltages ACT and RNL may be provided by the voltage circuit 400 of FIG. 4.

Figure 7:
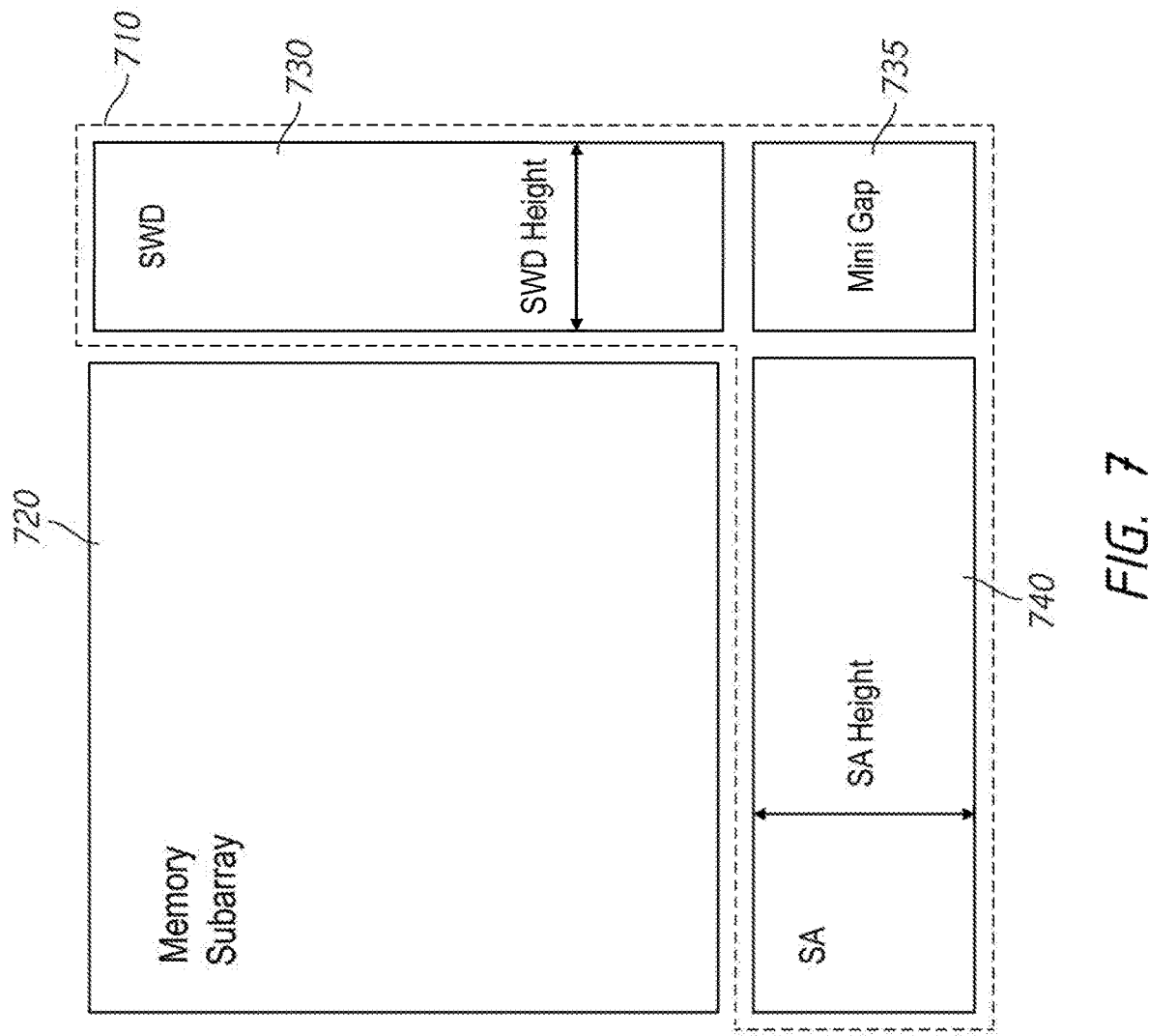
FIG. 7 is a diagram showing a layout for a portion of a peripheral region and a memory subarray region of a memory according to an embodiment of the disclosure.

FIG. 7 is a diagram showing a layout for a portion of a peripheral region 710 and a memory subarray region 720 of a memory according to an embodiment of the disclosure. In some embodiments of the disclosure, the memory subarray region 720 [FK1]may be included in a memory cell array (e.g., included in memory cell array 145 of FIG. 1) and the peripheral region 710 may be disposed adjacent to and/or between memory subarray regions.

The peripheral region 710 includes a sub-word line driver (SWD) region 730. The SWD region 730 may include sub-word line driver circuits that selectively drive sub-word lines of the memory subarray region 720 to activate selected memory cells for access. The peripheral region 710 may further include a sense amplifier (SA) region 740 in which sense amplifiers may be included (e.g., sense amplifier 300 in some embodiments of the disclosure).

A mini-gap region 735 included in the peripheral region 710 may have dimensions based on a SWD Height of the SWD region 730 and a SA Height of the SA region 740. The mini-gap region 735 may include circuits used when operating sub-word drivers of the SWD region 730 and/or operating sense amplifiers of the SA region 740. For example, the mini-gap region 735 may include voltage circuits that provide various voltages for operation of the sense amplifiers of the SA region 740. In some embodiments of the disclosure, one or more voltage circuits 400 of FIG. 4 is included in the mini-gap region 735.

In examples where the dimensions of the mini-gap region 735 are relatively compact, it may become challenging to include some circuits, for example, voltage circuits. Voltage circuits may have relatively large dimensions due to the need for sufficient drivability of various voltages.

Figure 8:
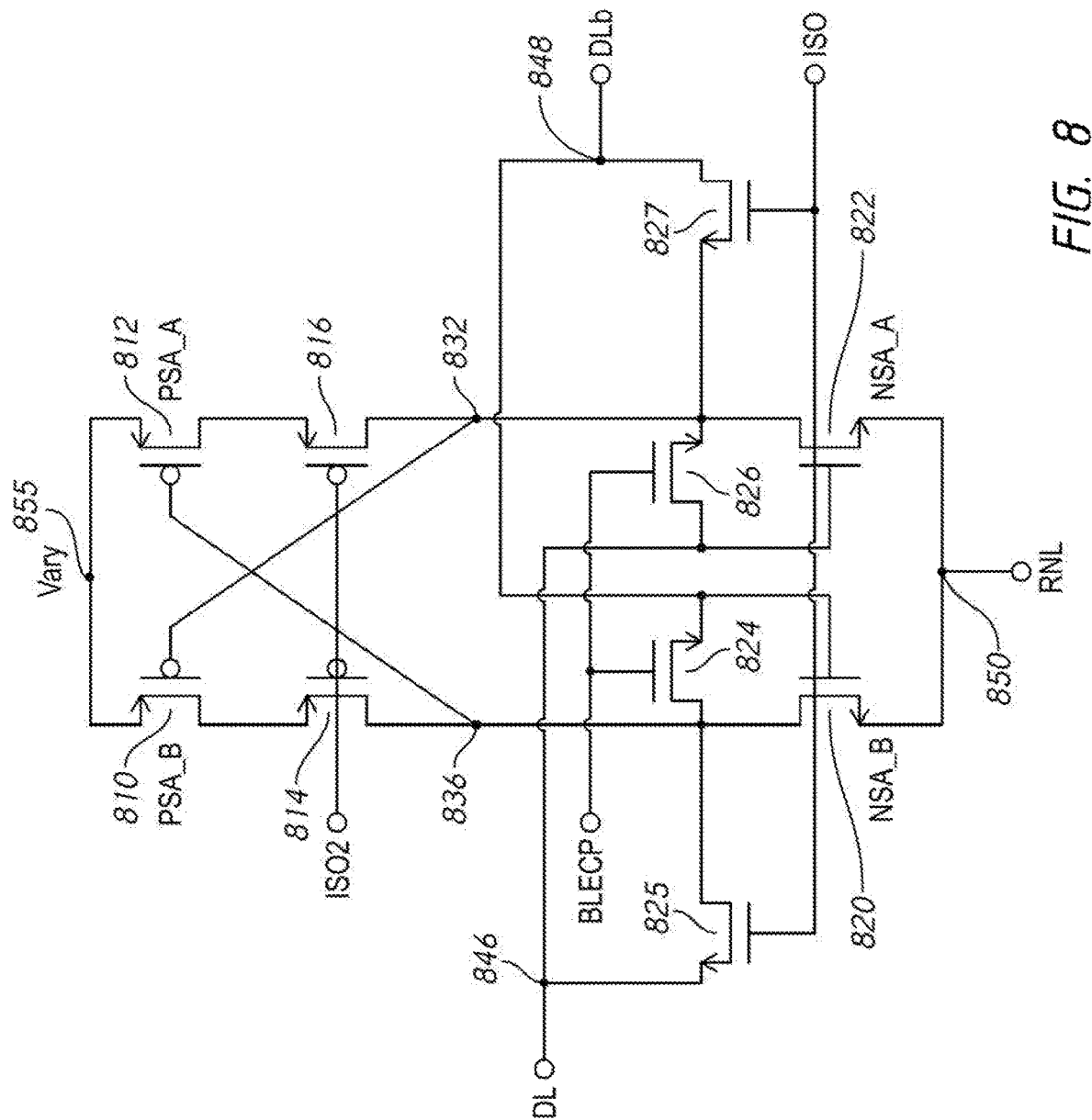
FIG. 8 is a schematic diagram of a sense amplifier in accordance with an embodiment of the disclosure.

FIG. 8 is a schematic diagram of a sense amplifier 800 in accordance with an embodiment of the disclosure. In some embodiments of the disclosure, the sense amplifier 800 may be included in one or more of the sense amplifiers 150 of FIG. 1 and/or the sense amplifier 210 of FIG. 2.

The sense amplifier 800 includes pull-up transistors 810 and 812 having drains coupled to nodes 836 and 832 through isolation transistors 814 and 816, all respectively. The isolation transistors 814 and 816 are activated by an active (e.g., active logic low) control signal ISO2. The sense amplifier 800 further includes pull-down transistors 820 and 822 having drains coupled to the nodes 836 and 832, respectively. The nodes 836 and 832 may be referred to in a non-limiting manner as "gut nodes" for convenience. Gates of the pull-up transistors 810 and 812 are coupled to gut nodes 832 and 836, respectively. Sources of the pull-up transistors 810 and 812 are coupled to a power supply node 855 that is provided a power supply voltage (e.g., Vary) and sources of the pull-down transistors 820 and 822 are coupled to a power supply node 850 that is provided a power supply voltage RNL.

The gut node 836 is coupled to a sense node 846 through an isolation transistor 825 and the gut node 832 is coupled to a sense node 848 through an isolation transistor 827. The isolation transistors 825 and 827 are activated by an active (e.g., active high logic level) control signal ISO. A digit line DL is coupled to the sense node 846 and a digit line DLb is coupled to the sense node 848. The digit line DL may represent digit line DL 220 of FIG. 2 and the digit line DLb may represent digit line DLb 221 in some embodiments of the disclosure.

The sense amplifier 800 further includes equalization transistors 824 and 826. The equalization transistor 824 is coupled to the gut node 836 and the sense node 848 and the equalization transistor 826 is coupled to the gut node 832 and the sense node 846. The equalization transistors 824 and 826 are activated by an active control signal BLECP (e.g., active high logic level).

The pull up transistors 810 and 812, and isolation transistors 814 and 816 are shown as p-type field effect transistors (PFETs) and the pull-down transistors 820 and 822, isolation transistors 825 and 827, and equalization transistors 824 and 826 are shown as n-type field effect transistors (NFETs) in FIG. 8. However, one or more of the transistors may be changed to a different type, to a different transistor, to a different circuit without departing from the scope of the disclosure.

As will be described below, the sense amplifier 800 may provide threshold voltage compensation. The sense amplifier 800 may be advantageous over conventional sense amplifiers providing threshold voltage compensation. For example, the sense amplifier 800 may be provided a constant power supply voltage (e.g., Vary) rather than a power supply voltage ACT that changes during operation of the sense amplifier and which may be provided by a voltage circuit. As a result, the sense amplifier 800, as well as other sense amplifiers according to embodiments of the disclosure, may operate without the need for a voltage circuit providing various high activation voltages (e.g., power supply voltage ACT), for example, voltage circuits that are typically included in a peripheral region, such as a mini-gap region. As a result, the voltage circuits may be reduced in size by eliminating the circuits necessary for providing high activation voltages, and leaving the circuits for providing low activation voltages (e.g., power supply voltage RNL).

Figure 9:
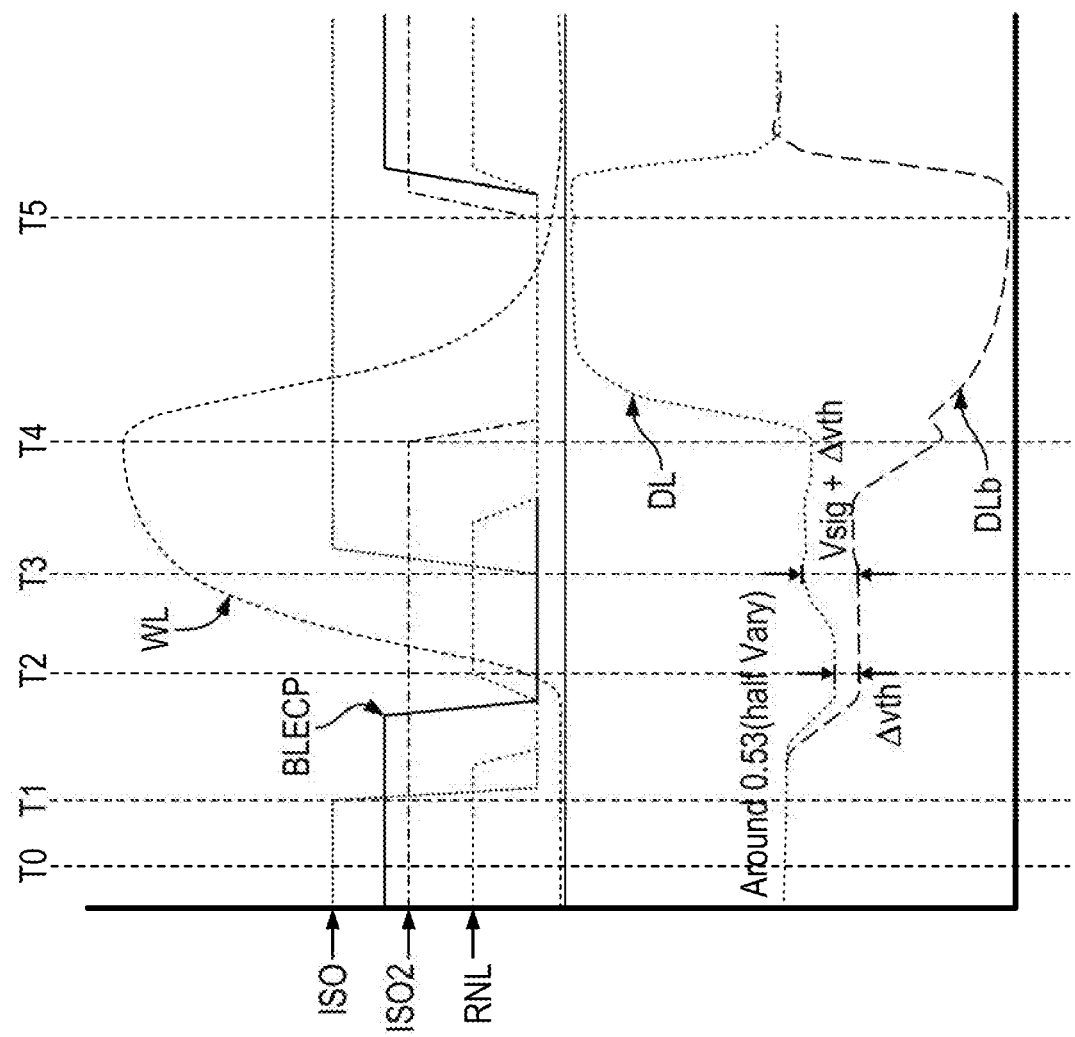
FIG. 9 is a timing diagram of various signals during the operation of a sense amplifier according to an embodiment of the disclosure.

An example operation of the sense amplifier 800 according to an embodiment of the disclosure is described with reference to FIG. 9. FIG. 9 is a timing diagram of various signals during the operation of a sense amplifier according to an embodiment of the disclosure. In some embodiments of the disclosure, the sense amplifier 800 of FIG. 8 may be operated according to the example of FIG. 9. The example operation of FIG. 9 will be described with reference to the sense amplifier of FIG. 8, however, neither the sense amplifier 800 or the example operation of FIG. 9 are limited as such.

Following time T0, the power supply node 850 is provided a precharge voltage, and power supply node 855 is provided a power supply voltage Vary. In some embodiments of the disclosure, the power supply voltage Vary is a constant voltage. Control signal ISO is active (e.g., active high logic level) to activate isolation transistors 825 and 827, and control signal ISO2 is inactive (e.g., inactive high logic level) to deactivate isolation transistors 814 and 816. Control signal BLECP is also active (e.g., active high logic level) to activate equalization transistors 824 and 826.

As a result, sense nodes 846 and 848 (and digit lines DL and DLb) are coupled together through activated isolation transistors 825 and 827, and activated equalization transistors 824 and 826 to equalize the voltage at the sense nodes 846 and 848 and on the digit lines DL and DLb. Gut nodes 832 and 836 are also provided the equalized voltage through activated isolation transistors 826 and 824. In some embodiments of the disclosure, the equalized voltage may be approximately one-half of the voltage of the power supply voltage Vary (e.g., approximately 0.53V).

In some embodiments of the disclosure, the precharge voltage provided to the power supply node 850 may be 0.5V, the power supply voltage Vary may be 1.0V, the active control signal ISO voltage may be 1.6V, the inactive control signal ISO2 may be 1.0V, and/or the active control signal BLECP may be 1.2V.

The operation between times T0 and T1 may be referred to as a precharge phase. During the precharge phase, the sense nodes 846 and 848 (and digit lines DL and DLb) are equalized and set to an equalized voltage.

Following time T1, the power supply voltage RNL provided to power supply node 850 switches to a low level activation voltage (e.g., ground, 0V). Also following time T1, the control signal ISO becomes inactive (e.g., inactive low logic level) to deactivate the isolation transistors 825 and 827. As a result, the sense nodes 846 and 848 (and the digit lines DL and DLb) are isolated from each other. The sense node 846 and the digit line DL remain at the equalized voltage shared with the gut node 832 and the sense node 848 and the digit line DLb remain at the equalized voltage shared with the gut node 836.

With the equalization transistors 824 and 826 still activated, pull-down transistors 822 and 820 are effectively diode-coupled (e.g., gate coupled to drain). As a result, drains of the pull-down transistor 822 and 820 are set to a voltage based on the respective threshold voltage vth_A and vth_B. Additionally, the voltage vth_A at the drain of the pull-down transistor 822 is provided to the sense node 846 and digit line DL through the active equalization transistor 826 and the voltage vth_B at the drain of the pull-down transistor 820 is provided to the sense node 848 and digit line DLb through the active equalization transistor 824.

In the present example, it is assumed the threshold voltage vth_A of the pull-down transistor 822 is greater than the threshold voltage vth_B of the pull-down transistor 820 by Δvth. That is, where the threshold voltage of the pull-down transistor 820 is vth, the threshold voltage of the pull-down transistor 822 is (vth+Δvth). The resulting voltage at the sense node 846 and digit line DL is (vth+Δvth) and the resulting voltage at the sense node 848 and digit line DLb is (vth). The voltage difference Δvth between the sense nodes 846 and 848 (and digit lines DL and DLb) compensates for a difference between the threshold voltages of the pull-down transistors 822 and 820.

Prior to time T2, the control signal BLECP becomes inactive (e.g., inactive low logic level, 0V) to deactivate the equalization transistors 826 and 824. With the equalization transistors 826 and 824 deactivated, the sense nodes 846 and 848 (and digit lines DL and DLb) are isolated and retain the respective voltages (vth+Δvth) and (vth).

The operation between times T1 and T2 may be referred to as a threshold voltage compensation (vtc) phase. During the threshold voltage compensation phase the sense nodes 846 and 848 and digit lines DL and DLb are set at respective compensation voltages to compensate for a threshold voltage difference between the pull-down transistors 822 and 820.

Following time T2, the power supply voltage RNL provided to the power supply node 850 changes to the precharge voltage. Also following time T2, an access line WL may be activated (e.g., changes to an activation (high) voltage level) to couple a memory cell to a digit line. The memory cell may change the voltage of the digit line (e.g., the voltage Vsig) to which it is coupled. In the present example, it is assumed that activation of the access line WL couples a memory cell to the digit line DL. It is further assumed that the memory cell stores a high cell state Vsig, which causes a voltage of the digit line DL and the sense node 846 to increase when coupled to the digit line DL.

The operation between times T2 and T3 may be referred to as a memory cell sampling phase. During the memory cell sampling phase a memory cell is coupled to one of the digit lines, and a voltage of the digit line to which the memory cell is coupled may change based on the data state stored by the memory cell.

Following time T3, the control signal ISO becomes active to activate the isolation transistors 827 and 825 and provide the voltage at the digit lines DLb and DL to the gut nodes 832 and 836, all respectively. Also following time T3, the power supply voltage RNL provided to the power supply node 850 changes to a low level activation voltage to activate the pull-down sense amplifier of pull-down transistors 822 and 820.

The low level activation voltage at the power supply node 850 causes the voltage difference between the digit lines DL and DLb (e.g., Vsig+Δvth) to begin to be amplified by driving the lower voltage digit line toward the low level activation voltage. In the present example, with the digit line DLb having a lower voltage than the digit line DL, the digit line DLb is driven toward the low level activation voltage through the activated isolation transistor 827 and the pull-down transistor 822. The pull-down transistor 822 is more conductive than the pull-down transistor 820 due to the higher voltage of the digit line DL provided to the gate of the pull-down transistor 822.

Also with the isolation transistors 827 and 825 activated, the gut node 832 is provided the voltage of the digit line DLb and the gut node 836 is provided the voltage of the digit line DL. Gates of the pull-up transistors 812 and 810 coupled to the gut nodes 836 and 832 are consequently provided the voltages of the digit lines DL and DLb, all respectively.

The operation between times T3 and T4 may be referred to as a pull-down sense amplifier activation phase. During the pull-down sense amplifier activation phase the voltage difference between the digit lines DL and DLb begins to be amplified by starting to drive one of the digit lines towards a low level activation voltage.

Following time T4, the control signal ISO2 becomes active (e.g., active low logic level) to activate the isolation transistors 816 and 814 to couple gut nodes 832 and 836 to drains of pull-up transistors 812 and 810, all respectively. The access line WL may also become inactive (e.g., changed to an inactive (low) voltage level) to isolate the memory cell from the digit line DL.

As previously described, the gate of the pull-up transistors 812 is provided the voltage of the sense node 846 and digit line DL and the gate of the pull-up transistor 810 is provided the voltage of the sense node 848 an digit line DLb. With the voltage of the digit line DLb lower than the digit line DL from the pull-down sense amplifier activation phase, the pull-up transistor 810 is activated to a greater extent than the pull-up transistor 812. As a result, the gut node 836 begins to be driven to the power supply voltage Vary through the pull-up transistor 810, which causes the voltage of the digit line DL to also increase. The increasing voltage of the gut node 836 in turn further activates the pull-down transistor 822 to continue driving the digit line DLb towards the low level activation voltage provided to the power supply node 850.

A positive feedback loop of the activated pull-down transistor 822 and activated pull-up transistor 810 fully drive the digit line DLb (and the sense node 848 and gut node 832) to the low level activation voltage and fully drive the digit line DL (and the sense node 846 and the gut node 836) to the power supply voltage Vary.

The operation between times T4 and T5 may be referred to as a pull-up sense amplifier activation phase. During the pull-up sense amplifier activation phase the voltage difference between the digit lines DL and DLb from the pull-down sense amplifier activation phase is further amplified by fully driving the digit lines DL and DLb to opposite voltage levels (e.g., the power supply voltage Vary and the low level activation voltages) based on the voltage difference.

Following time T5, the digit lines DL and DLb may be precharged, for example, as previously described with reference to the precharge phase between times T0 and T1. The power supply voltage RNL provided to the power supply node 850 changes to the precharge voltage, and the isolation transistors 816 and 814 are deactivated by the control signal ISO2 becoming inactive. Additionally, the equalization transistors 826 and 824 are activated by the control signal BLECP becoming active. As a result, as previously described, sense nodes 846 and 848, and digit lines DL and DLb are coupled together through (already) activated isolation transistors 827 and 825, and equalization transistors 826 and 824 to equalize the voltage on the sense nodes 846 and 848, and digit lines DL and DLb. Gut nodes 832 and 836 are also provided the equalized voltage through activated isolation transistors 827 and 825.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
   a first pull-up transistor coupled to a first power supply node;
   a second pull-up transistor coupled to the first power supply node;
   a first pull-down transistor coupled to a second power supply node;
   a second pull-down transistor coupled to the second power supply node;
   a first isolation transistor coupled to a first sense node to which the first pull-up and first pull-down transistors are also coupled, and the first isolation transistor further coupled to a gate of the second pull-down transistor;
   a second isolation transistor coupled to a second sense node to which the second pull-up and second pull-down transistors are also coupled, and the second isolation transistor further coupled to a gate of the first pull-down transistor,
   an equalization transistor coupled to the gates of the first and second pull-down transistors; and
   a precharge transistor coupled to the second power supply node and further coupled to the gate of either the first or second pull-down transistors.

2. The apparatus of claim 1 wherein the first isolation transistor is further coupled to a gate of the second pull-up transistor and the second isolation transistor is further coupled to a gate of the first pull-up transistor.

3. The apparatus of claim 1 wherein a gate of the first pull-up transistor is coupled to the second sense node and the gate of the second pull-up transistor is coupled to the first sense node.

4. The apparatus of claim 1 wherein the first sense node is configured to be coupled to a first digit line and the second sense node is configured to be coupled to a second digit line.

5. The apparatus of claim 1 the first and second pull-up transistors comprise p-type transistors and the first and second pull-down transistors comprise n-type transistors.

6. The apparatus of claim 1 wherein the first and second pull-up transistors, the first and second pull-down transistors, the first and second isolation transistors, the equalization transistor, and the precharge transistor are included in a sense amplifier, and wherein the first power supply node is configured to receive a first power supply voltage and the second power supply node is configured to receive a second power supply voltage, and the first and second power supply voltages change during operation of the sense amplifier.

7. The apparatus of claim 1 wherein the equalization and precharge transistors are configured to be activated, the first and second isolation transistors configured to be deactivated, and the second power supply node is configured to receive a higher power supply voltage than the first power supply node, all during a threshold voltage compensation phase.

8. An apparatus, comprising:
a first pull-up transistor coupled to a first power supply node;
a second pull-up transistor coupled to the first power supply node;
a first pull-down transistor coupled to a second power supply node and having a gate coupled to first sense node;
a second pull-down transistor coupled to the second power supply node and having a gate coupled to a second sense node;
a first isolation transistor coupled to the first pull-up transistor and further coupled to the first pull-down transistor at a first gut node;
a second isolation transistor coupled the second pull-up transistor and further coupled to the second pull-down transistor at a second gut node;
a first equalization transistor coupled to the first gut node and the first sense node;
a second equalization transistor coupled to the second gut node and the second sense node;
a third isolation transistor coupled to the second sense node and the first gut node; and
a fourth isolation transistor coupled to the first sense node and the second gut node.

9. The apparatus of claim 8 wherein a gate of the first pull-up transistor is coupled to the second gut node and a gate of the second pull-up transistor is coupled to the first gut node.

10. The apparatus of claim 8 wherein the first and second isolation transistors are configured to be activated responsive to an active first activation signal and the third and fourth isolation transistors are configured to be activated responsive to an active second activation signal.

11. The apparatus of claim 8 wherein the first and second equalization transistors are activated responsive to an activate equalization control signal.

12. The apparatus of claim 8 wherein the first and second isolation transistors are deactivated responsive to an inactive first activation signal and the third and fourth isolation transistors are deactivated responsive to an inactive second activation signal, and a power supply voltage provided to the second power supply node changes during a threshold voltage compensation phase.

13. The apparatus of claim 8 wherein the first and second pull-up transistors, the first and second pull-down transistors, the first, second, third, and fourth isolation transistors, and the first and second equalization transistors are included in a sense amplifier circuit, and wherein the first power supply node is provided a constant power supply voltage during operation of the transistors.

14. The apparatus of claim 8 wherein the first and second pull-up transistors, and the first and second isolation transistors comprise p-type transistors, and wherein the first and second pull-down transistors, first and second equalization transistors, and the third and fourth isolation transistors comprise n-type transistors.

15. The apparatus of claim 8 wherein the first and second sense nodes are configured to be precharged to a voltage based on sharing opposite power supply voltages between the two sense nodes.

16. A method, comprising:
precharging and equalizing first and second sense nodes of a sense amplifier;
isolating the first and second sense nodes of the sense amplifier; and
increasing a power supply voltage provided to a power supply node to which gates and sources of first and second pull-down transistors are coupled to provide respective voltages at the first and second sense nodes for threshold voltage compensation for the first and second pull-down transistors.

17. The method of claim 16, further comprising Isolating the gates of the first and second pull-down transistors.

18. The method of claim 16 wherein precharging the first and second sense nodes of the sense amplifier comprises precharging the first and second sense nodes to a precharge voltage provided to the power supply node.

19. A method, comprising:
sharing voltages of first and second sense nodes to precharge the first and second sense nodes;
isolating the first and second sense nodes;
decreasing a power supply voltage provided to a power supply node to cause the first and second sense nodes to discharge through respective diode coupled pull-down transistors to respective sense node voltages to provide threshold voltage compensation for the pull-down transistors.

20. The method of claim 19, further comprising isolating the first and second sense nodes from drains of the pull-down transistors.

* * * * *